United States Patent
Laskowsky et al.

(10) Patent No.: US 10,288,692 B2
(45) Date of Patent: May 14, 2019

(54) SYSTEMS AND METHODS FOR ESTIMATING BATTERY SYSTEM PARAMETERS

(71) Applicant: GM GLOBAL TECHNOLOGY OPERATIONS LLC, Detroit, MI (US)

(72) Inventors: Patricia M. Laskowsky, Ann Arbor, MI (US); Patrick Frost, Berkley, MI (US); Raghunathan K, Troy, MI (US); Brian J. Koch, Berkley, MI (US); John E. Novak, Dexter, MI (US)

(73) Assignee: GM Global Technology Operations LLC, Detroit, MI (US)

(*) Notice: Subject to any disclaimer, the term of this patent is extended or adjusted under 35 U.S.C. 154(b) by 368 days.

(21) Appl. No.: 14/739,639

(22) Filed: Jun. 15, 2015

(65) Prior Publication Data

US 2016/0363630 A1 Dec. 15, 2016

(51) Int. Cl.
| | |
|---|---|
| *B60L 11/18* | (2006.01) |
| *H01M 10/42* | (2006.01) |
| *H01M 10/44* | (2006.01) |
| *G01R 19/00* | (2006.01) |
| *G01R 31/36* | (2006.01) |
| *H01M 10/63* | (2014.01) |

(52) U.S. Cl.
CPC ....... *G01R 31/3651* (2013.01); *G01R 31/362* (2013.01); *G01R 31/3606* (2013.01); *B60L 11/1862* (2013.01); *H01M 10/44* (2013.01); *H01M 2010/4271* (2013.01); *H01M 2250/20* (2013.01); *Y02T 10/7044* (2013.01); *Y02T 90/34* (2013.01)

(58) Field of Classification Search
CPC .................................................. G01R 31/3651
USPC ............................................................. 702/63
See application file for complete search history.

(56) References Cited

U.S. PATENT DOCUMENTS

| | | | |
|---|---|---|---|
| 4,522,179 A | 6/1985 | Nishimura et al. | |
| 2013/0261914 A1* | 10/2013 | Ingram | B64C 39/024 701/70 |
| 2013/0317771 A1* | 11/2013 | Laskowsky | H01M 10/482 702/63 |
| 2015/0070024 A1* | 3/2015 | Kim | G01R 31/3679 324/430 |

FOREIGN PATENT DOCUMENTS

| | | |
|---|---|---|
| CN | 103890351 A | 6/2014 |
| CN | 106246381 A | 12/2016 |

* cited by examiner

*Primary Examiner* — Ly D Pham
(74) *Attorney, Agent, or Firm* — Quinn IP Law

(57) ABSTRACT

System and methods for estimating a relationship between a SOC and an OCV of a battery system included in a vehicle are presented. In certain embodiments, an initial relationship between an open circuit voltage ("OCV") and a state of charge ("SOC") of a cell of the battery system may be determined at a beginning of life of the cell. Changes in one or more stoichiometric points of a half-cell of the cell may be determined as the cell ages. Based on the determined stoichiometric point changes of the half-cell, an initial relationship between the OCV and the SOC of the cell may be adjusted to generate an updated relationship between the OCV and the SOC of the cell.

20 Claims, 5 Drawing Sheets

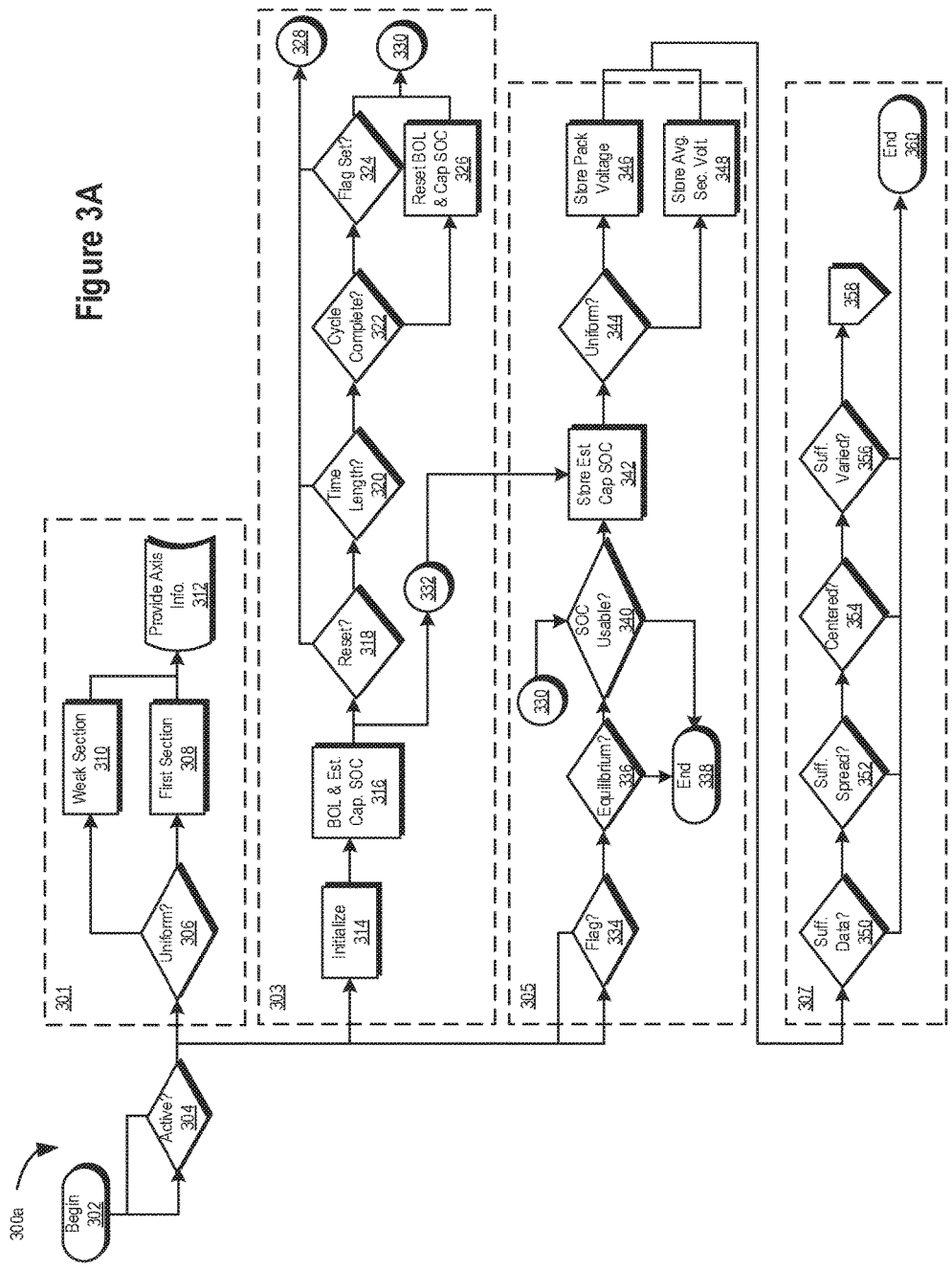

SYSTEMS AND METHODS FOR ESTIMATING BATTERY SYSTEM PARAMETERS

TECHNICAL FIELD

This disclosure relates to systems and methods for estimating parameters of a battery system. More specifically, but not exclusively, the systems and methods disclosed herein relate to estimating changes in a relationship between a state-of-charge and an open-circuit voltage of a battery system as the battery system ages over time.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Information regarding a relationship between state-of-charge ("SOC") and an open-circuit voltage ("OCV") of a battery system may be utilized in modeling battery system performance and/or in connection with battery system control and/or management decisions. For example, information regarding energy stored in a battery system included in a vehicle, which may be determined using an SOC-OCV curve associated with the battery system, may be utilized in estimating a range of the vehicle. In some embodiments, various battery system parameter and/or performance information may be determined by a battery state estimation ("BSE") system associated with the battery system.

The electrical behavior of a battery system may change over time as the battery system ages. For example, a charge capacity of the battery system may decrease and an equilibrium voltage (e.g., an OCV) of the battery system for a given SOC may shift from its value at the beginning-of-life ("BOL") of the battery system. Certain algorithms used in connection with estimating battery system parameter and/or performance information, however, may not account for such changes and may assume that an OCV/SOC relationship for the battery system is static throughout its life.

SUMMARY

Systems and methods disclosed herein may provide for improved estimation of relationship between OCV and SOC of a battery system as the battery system ages. Information relating to an estimated relationship between an OCV and a SOC of a battery system may be utilized in connection with a variety of applications including, without limitation, modelling battery system parameters and/or performance information such as battery capacity estimation, power capability estimation, and vehicle range estimation. Embodiments of the disclosed systems and methods may thus improve the accuracy such estimations throughout the life of the battery system. In some circumstances, these improvements may improve the reliability and driving consistency of a vehicle powered by a battery system. In further embodiments, updated stoichiometry parameters utilized in connection with the disclosed embodiments may be used to create more reliable state-of-health ("SOH") diagnostics for battery systems, packs, sections, and/or cells, which may decrease costs of servicing battery systems, as well as improving battery life modeling activities.

In some embodiments, a method for estimating a relationship between SOC and an OCV of a battery system included in a vehicle may include determining an initial relationship between an OCV and a SOC of a cell of the battery system at a BOL of the cell. A change in one or more stoichiometric points of a half-cell of the cell may be determined. In certain embodiments, determining the change in the one or more stoichiometric points of the half-cell may include, measuring parameter information relating to one or more operating parameters of a battery pack including the half-cell, storing the measured parameter information in one or more data bins, identifying one or more updated stoichiometric points of the half-cell based on the stored measured parameter information using an optimization process (e.g., a gradient optimization process and/or the like), and determining the change in the one or more stoichiometric points based on the one or more identified updated stoichiometric points.

In certain embodiments, the measured parameter information comprises at least one of a voltage of the battery pack, a SOC of the battery pack, and a time when a controller associated with the battery system initializes. The one or more data bins may be designated in certain embodiments based on a SOC associated with the initial relationship between the OCV and the SOC. In some embodiments, prior to identifying the one or more updated stoichiometric points of the half-cell, a sufficiency of the measured parameter information stored in the one or more data bins may be determined.

Based in part on the determined change in the one or more stoichiometric points of the half-cell, the initial relationship between the OCV and the SOC of the cell may be adjusted to generate an updated relationship between the OCV and the SOC of the cell. In certain embodiments, the updated relationship between the OCV and the SOC of the cell may comprise an OCV/SOC curve associated with the cell. In further embodiments, a control action in a vehicle associated with the battery system based on the updated relationship between the OCV and the SOC of the cell. In yet further embodiments, at least one operating parameter of the battery system may be determined based on updated relationship between the OCV and the SOC of the cell.

In certain embodiments, the aforementioned method may be performed by a BSE system and/or any other computing system and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which:

FIG. 3A illustrates a flow chart of a first part of an exemplary method for determining a relationship between a SOC and an OCV of a battery system consistent with embodiments disclosed herein.

DETAILED DESCRIPTION

Figure 1:
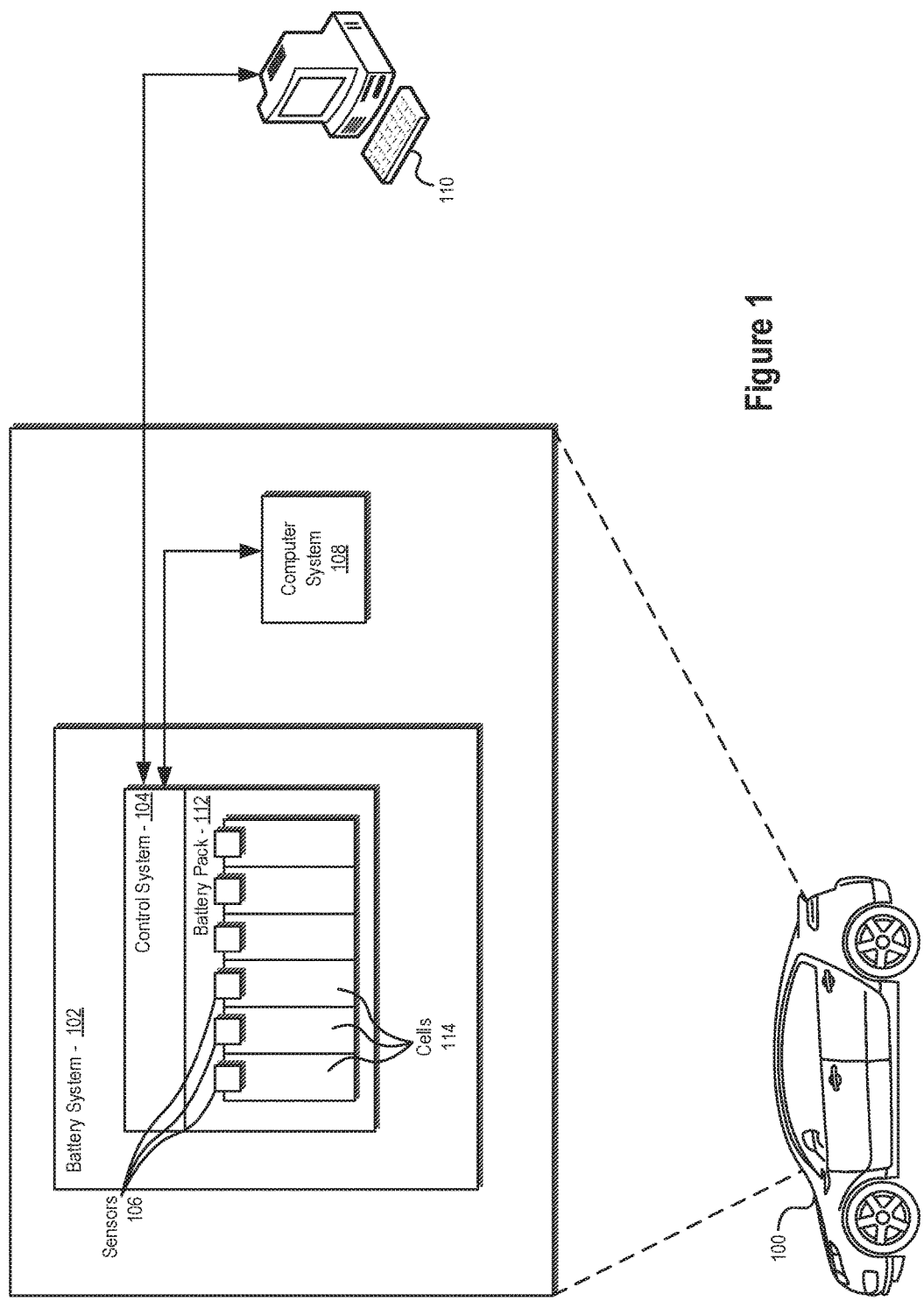
FIG. 1 illustrates an exemplary system for determining a relationship between a SOC and an OCV of a battery system included in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may provide for improved estimation of a relationship between an OCV and a SOC of a battery system. In some embodiments, the disclosed systems and methods may provide estimation of a relationship between OCV and SOC of a battery system, which may be represented by a SOC-OCV curve, throughout a lifecycle of the battery system. In certain embodiments, SOC-OCV curve estimations may be performed by a BSE system and/or another battery control, monitoring, testing, modeling, and/or management system.

When a battery cell ages, the SOC-OCV relationship of the cell may shift as a result of loss of active material in the battery cell electrodes and/or loss of active lithium in the cell, thereby causing a change in an OCV of the battery cell for a given SOC. In certain embodiments, a relationship between an OCV and a SOC of a full battery cell may be calculated from the SOC-OCV relationships of the individual electrodes. For a given SOC, the full cell OCV may be the difference between the OCVs of the positive and negative electrodes at that same cell SOC. The full cell OCV curve may be constructed over an entire range of SOC by taking the differences between electrode OCV curves over the same range. The electrodes, however, may not have identical capacities, and an electrode may have excess capacity that is not always used in the full cell. This may give rise to a question of the relative alignment between the electrode SOC-OCV curves in the context of the full cell.

Consistent with embodiments disclosed herein, this alignment and/or the extent to which each half-cell curve is utilized in the full cell may be described by one or more stoichiometric points. By selecting the correct stoichiometric points and taking the differences between the electrode OCV curves in the range defined by the points, the BOL cell SOC-OCV curve can be produced. Consistent with the disclosed embodiments, shifting and scaling of the individual half-cell SOC axes curves can be accomplished by changing the stoichiometric points to produce an altered full cell SOC-OCV curve that is representative of a battery that has experienced some loss of active material with age. Assuming that half-cell SOC-OCV shifting and scaling accurately captures the aging mechanisms in the battery, this process may be used to model the evolution of a real-world full cell SOC-OCV curve over time.

To determine a change in the stoichiometric points, embodiments of the systems and methods disclosed herein may utilize data collection and optimization processes. In certain embodiments, a battery pack and/or section voltage may be measured, a SOC of the pack and/or section may be determined based on a present capacity of the pack and/or section, and a time when a vehicle controller initiates and/or otherwise turns on with the battery pack and/or section at equilibrium may be identified. This information may be stored and sorted into one or more data bins based on a SOC calculated from a BOL charged capacity. In some embodiments, this may ensure a wide variety of data is used in connection with the disclosed systems and methods. Upon determining that the data bins are filled with a sufficient amount of data and the data within the bins is sufficiently varied, an optimization process (e.g., a gradient descent optimization process and/or any other suitable optimization process) may be performed to identify stoichiometric points of the anode and the cathode electrodes that fit the collected data. Identified stoichiometric points may be blended into a previous history and then applied to calculate a new OCV axis for an OCV/SOC curve associated with the battery pack and/or section. In certain embodiments, identified stoichiometric points may be blended by applying a low pass smoothing filter (e.g., a recursive-least squares filter and/or any other type of suitable filter) to the history of stoichiometric point updates to prevent the stoichiometric points (and thus the OCV/SOC calculated based on the same) from changing irregularly over time.

Consistent with the disclosed embodiments, by determining the lithium stoichiometry of a cell in a battery system, the cell's SOC may be related according to the utilization of the individual electrodes, x and y, according to the following:

$$V(SOC) = U_{pos}(SOC(x_f - x_i) + x_i) - U_{neg}(y_i + SOC(y_f - y_i)). \quad \text{Eq. 1}$$

where V is the full-cell OCV, $U_{pos}$ is the positive electrode OCV, $U_{neg}$ is the negative electrode OCV, $x_f$ is the positive electrode utilization corresponding to a 100% full-cell SOC (which may not change appreciably with age), $x_i$ is the positive electrode utilization corresponding to 0% full-cell SOC which may be optimized in connection with determining an OCV/SOC curve, $y_f$ is the negative electrode utilization corresponding to a 100% full-cell SOC which may be optimized in connection with determining an OCV/SOC curve, $y_i$ is the negative electrode utilization corresponding to 0% full-cell SOC (which may not change appreciably with age), and SOC is the full-cell state of charge. In certain embodiments, $U_{pos}$ and $U_{neg}$ may depend on the electrodes utilization, which may correspond to SOC. SOC*$(x_f-x_i)+x_i$ and $y_i+$SOC*$(y_f-y_i)$ may be the equivalent utilization of each electrode given degradation with age.

In some embodiments, the stoichiometry coefficients, $x_f$ and $y_i$, may show insufficient sensitivity to aging and therefore can be held constant. Using collected rested voltage data and SOC points of the battery system, the remaining coefficients, $x_i$ and $y_f$, may be optimized.

In certain embodiments, an optimization process may be utilized in connection with minimizing the error function $f(x_i, y_f)$, which may be expressed according to:

$$\min(f(x_i,y_f))=\min(\Sigma|V_{meas}-V_{est}(x_i,y_f)|)\approx 0. \qquad \text{Eq. 2}$$

where $V_{meas}$ is the measured equilibrated voltage and $V_{est}$ is the estimated open circuit voltage.

Optimizing $x_i$ and $y_f$ may minimize $f(x_i, y_f)$ where $V_{est}$ may be expressed according to:

$$V_{est}(x_i,y_f)=U_{pos}(\text{SOC}\cdot(x_f-x_i)+x_i)-U_{pos}(y_i+\text{SOC}\cdot(y_f-y_i)) \qquad \text{Eq. 3}$$

Embodiments of the disclosed systems and methods may utilize a variety of optimization processes. In some embodiments, a gradient descent optimization process may be utilized, which may follow a steepest partial derivative direction to set a next parameter update.

In certain embodiments, a next parameter update iteration scheme may be expressed according to:

$$(x_{i_{n+1}}, y_{f_{n+1}}) = (x_{i_n}, y_{f_n}) - \alpha \cdot \left( \frac{\partial f(x_{i_n}, y_{f_n})}{\partial x_i}, \frac{\partial f(x_{i_n}, y_{f_n})}{\partial y_f} \right) \qquad \text{Eq. 4}$$

where $$\frac{\partial f(x_{i_n}, y_{f_n})}{\partial x_i}, \frac{\partial f(x_{i_n}, y_{f_n})}{\partial y_f}$$

may be derived from the following:

$$\frac{\partial f(x_{i_n}, y_{f_n})}{\partial x_i} = \frac{f(x_{i_n}+h)-f(x_{i_n})}{h} \qquad \text{Eq. 5}$$

$$\frac{\partial f(x_{i_n}, y_{f_n})}{\partial y_f} = \frac{f(y_{f_n}+h)-f(y_{f_n})}{h} \qquad \text{Eq. 6}$$

The optimization process may be run until a certain number of iterations, n, is reached or until eps is less than a maximum allowable error.

FIG. 1 illustrates an exemplary system for determining a relationship between a SOC and an OCV of a battery system 102 consistent with embodiments disclosed herein. In certain embodiments, the battery system 102 may be included in a vehicle 100. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like. Although illustrated in connection with a battery system 102 included in a vehicle 100, it will be appreciated that embodiments of the disclosed systems and methods may be implemented in connection with a wide variety of battery systems including in connection with batteries systems that are not included in a vehicle.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate, model, and/or otherwise determine battery system energy capability. In certain embodiments, the battery control system 104 may be communicatively coupled with one or more sensors 106 (e.g., voltage sensors, current sensors, and/or the like, etc.) and/or other systems (e.g., internal computer system 108, external computer system 110, etc.) configured to enable the battery control system 104 to monitor and control operations of the battery system 102 and/or perform certain methods disclosed herein. For example, sensors 106 may provide battery control system 104 with information used to estimate a SOC and/or a SOE, estimate an impedance, measure a current, measure voltage of a battery pack 112 and/or constituent battery cells 114, and/or any other information that may be utilized in connection with the disclosed embodiments.

The battery control system 104 may further be configured to provide information to and/or receive information from other systems (e.g., internal computer system 108) included in the vehicle 100 that, in some embodiments, may comprise BSE systems. For example, the battery control system 104 may be communicatively coupled with an internal vehicle computer system 108 and/or an external computer system 110 (e.g., via a wired and/or wireless telecommunications system or the like) configured to perform BSE methods consistent with the disclosed embodiments. In some embodiments, the internal vehicle computer system 108 and/or an external computer system 110 may be configured to determine a relationship between a SOC and an OCV of a battery system 102 as the battery system ages consistent with embodiments disclosed herein In certain embodiments, the battery control system 104 may be configured, at least in part, to provide information regarding the battery system 102 (e.g., information measured by sensors 106 and/or determined by control system 104) to a user, testing personnel, service personnel, and/or the like of the vehicle 100, the vehicle computer system 108, and/or the external computer system 110. Such information may include, without limitation, battery SOC, SOE, and/or state of health ("SOH") information, battery energy capability information, battery operating time information, battery cycle information, battery operating temperature information, vehicle range information, and/or any other information regarding the battery system 102 that may be utilized in connection with determining battery system energy capability information and/or information used in connection with battery system 102 and/or vehicle 100 management and/or control operations.

The battery system 102 may include one or more battery packs 112 suitably sized to provide electrical power to the vehicle 100. Each battery pack 112 may include one or more battery cells 114. The battery cells 114 may utilize any suitable battery technology or combination thereof. Suitable battery technologies may include, for example, lead-acid, nickel-metal hydride ("NiMH"), lithium-ion ("Li-Ion"), Li-Ion polymer, zinc-air, lithium-air, nickel-cadmium ("Ni-Cad"), valve-regulated lead-acid ("VRLA") including absorbed glass mat ("AGM"), nickel-zinc ("NiZn"), molten salt (e.g., a Na—$NiCl_2$ battery), and/or other suitable battery technologies. Each battery cell 114 may be associated with sensors 106 configured to measure one or more parameters (e.g., voltage, current, temperature, etc.) associated with each cell 114. Although FIG. 1 illustrates separate sensors 106 associated with each battery cell 114, in some embodiments a sensor configured to measure various electrical parameters associated with a plurality of cells 114 may also be utilized.

Information measured by sensors 106 may be provided to the battery control system 104 and/or one or more other systems (e.g., internal computer system 108 and/or external computer system 110). Using the information, the battery control system 104 and/or any other suitable system may coordinate the operation of battery system 102 (e.g., charging operations, discharging operations, balancing operations, etc.). The battery control system 104, internal computer system 108, external computer system 110, and/or any other suitable system implementing BSE methods may further utilize such information in connection with the disclosed embodiments to determination an relationship between a SOC and an OCV of the battery system 102 as part of monitoring, control, characterization, and/or modeling activities.

Figure 2:
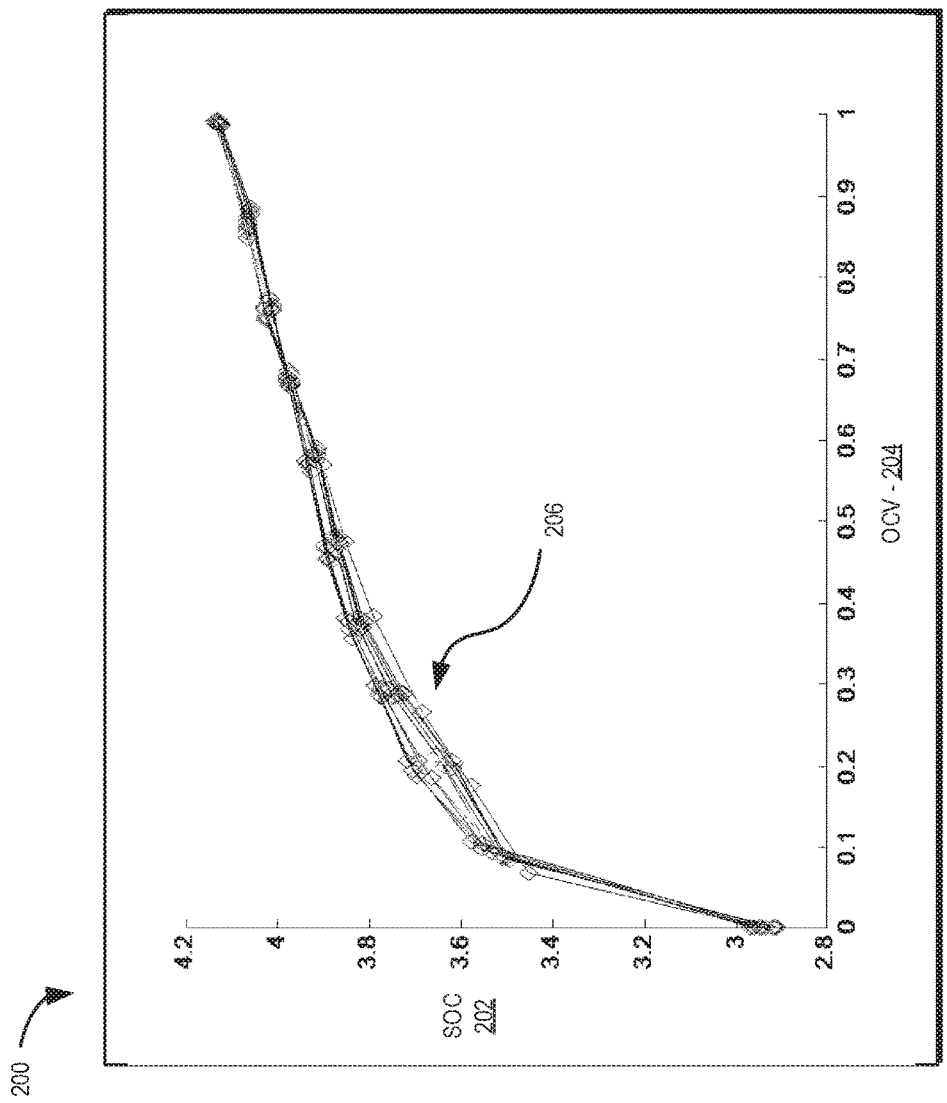
FIG. 2 illustrates a graph showing a relationship between a SOC and an OCV of an exemplary battery system over time consistent with embodiments disclosed herein.

FIG. 2 illustrates a graph showing a relationship between a SOC 202 and an OCV 204 of an exemplary battery system over time consistent with embodiments disclosed herein. Particularly, graph 200 illustrates a variety of exemplary SOC/OCV curves 206 throughout a lifecycle of the battery (e.g., from BOL to end-of-life ("EOL")). As illustrated, an OCV 204 associated with SOC/OCV curves 206 may decrease at higher SOCs 202 and may increase at lower SOCs 202 as the battery system ages. Consistent with embodiments disclosed herein, such changes over time may be accounted for in estimating a relationship between SOC 202 and OCV 204 of a battery system in connection with BSE methods and/or battery system monitoring, control, characterization, and/or modeling activities.

Figure 3B:
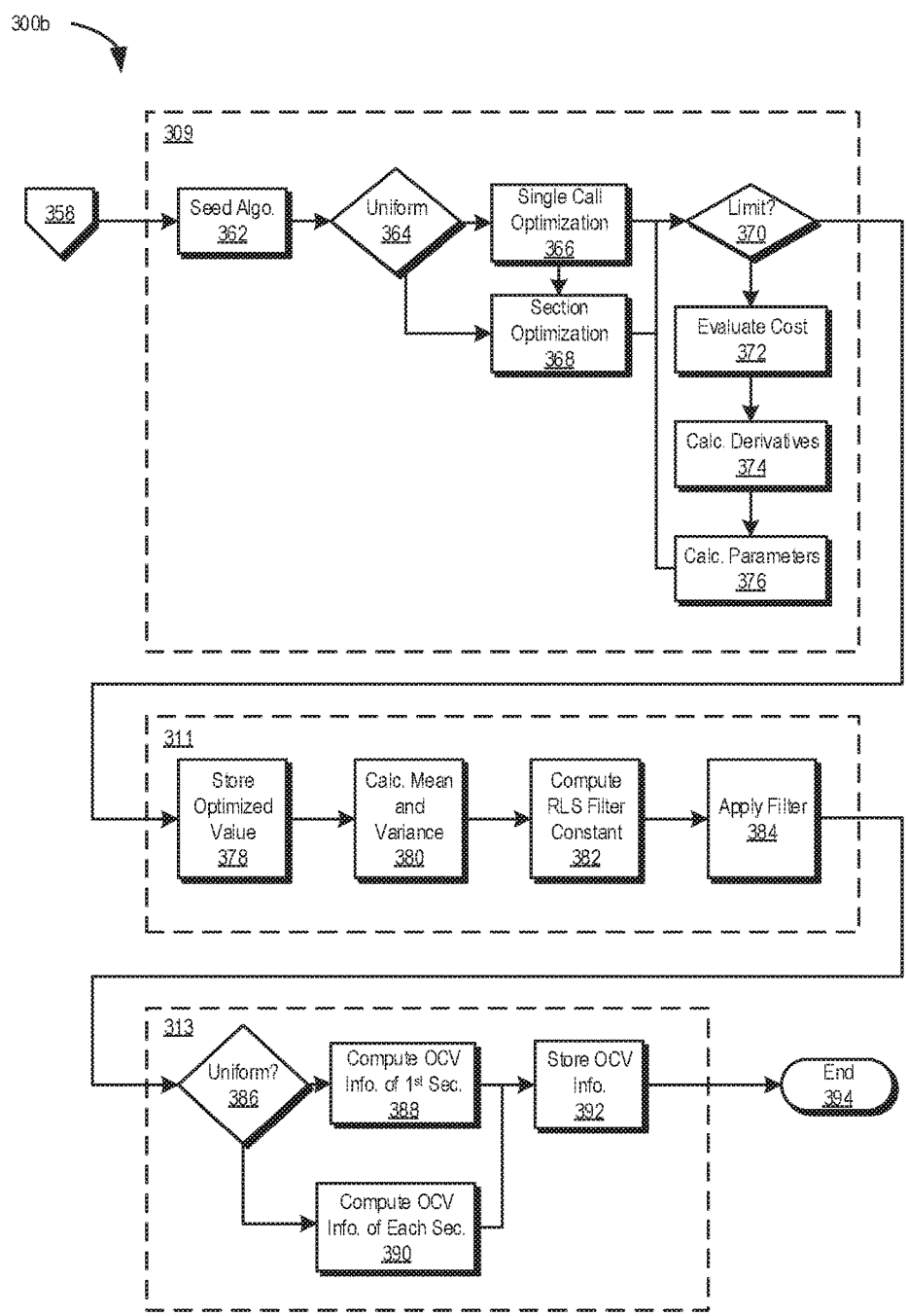
FIG. 3B illustrates a flow chart of a second part of an exemplary method for determining a relationship between a SOC and an OCV of a battery system consistent with embodiments disclosed herein.

FIGS. 3A-3B illustrates flow charts 300a, 300b of an exemplary method for determining a relationship between a SOC and an OCV of a battery system consistent with embodiments disclosed herein. In certain embodiments, one or more of the illustrated elements of the method may be performed by and/or implemented using a battery control system, an internal computer system, an external computer system, and/or any other system or combination of systems configured implemented BSE methods and/or, monitor, model, and/or otherwise characterize parameters of a battery system including an SOC/OCV curve associated with the battery system.

The illustrated method may comprise one or more OCV axis output steps 301, SOC computation steps 303, data validity determination and capture steps 305, data sufficiency determination steps 307, stoichiometric value optimization steps 309, optimization blending steps 311, and/or OCV axis computation steps 313. At 302, the method may initiate. At 304, a determination may be made whether a battery controller and/or control system associated with the battery system is on and/or is otherwise in an active state. If not, the method may wait until it is determined that the battery controller is on and/or active. If the battery controller and/or control system associated with the battery system is on and/or otherwise active, the method may proceed to steps 306, 314, and 334. In some embodiments, steps 306, 314, and 334, described in more detail below, may proceed in parallel and/or in any suitable order to effectuate the disclosed embodiments.

At 306, a determination may be made whether the sections of the battery system (e.g., battery system subdivisions) have uniform and/or substantially uniform capacity. If the sections do not have uniform and/or substantially uniform capacity, the method may proceed to 310 where previously stored OCV axis information associated with a SOC/OCV curve for the weakest section of the battery system may be retrieved. If the sections have uniform and/or substantially uniform capacity, the method may proceed to 308 where previously stored OCV axis information associated with a first battery section of the battery system may be retrieved. The OCV axis information retrieved at either 308 or 310 may be provided at 312 to various software components and/or for use in connection with other steps in the illustrated method.

In some embodiments, certain embodiments of the disclosed methods may be applied in connection with an entire battery system, a battery pack, a pack as a number of sections, and/or an individual cell and/or any other portion of a battery system based on available measurement information. As used herein, a portion of the battery system may comprise an entire battery system and/or any constituent subdivision of the same, a pack (e.g., a pack having a number of cells), a cell, and/or the like. In some embodiments, the methods may be used in connection with a weakest section and/or cell of the battery system (e.g., a first battery section). If the battery sections/cells are relatively uniform, the first section may be considered to be representative of the pack and thus be used in connection with embodiments of the disclosed methods.

At 314, a frame-specific BOL SOC and estimated capacity SOC for the battery system may be initialized. Current may be integrated to compute a BOL SOC for the battery system and an estimated capacity SOC for the battery system at 316. As used herein, a frame-specific BOL SOC may be a BOL SOC associated with a particular software functional division. This information may be passed to 332 for use in connection with other steps in the method.

At 318, a determination may be made whether a non-volatile memory reset has occurred (e.g., whether a reset has occurred within a preceding time period or the like). If so, a flag may be set at 328 indicating that the calculated SOC should not be used in connection with the disclosed method, which in some embodiments may cause the method to terminate. If a reset has not occurred, the method may proceed to 320, where a time since a last charge cycle of completion may be compared against a threshold to determine whether too long of time has elapsed. In some embodiments, the threshold may comprise a value that may represent when the integrated current sensor error is too high to calculate an accurate OCV/SOC curve. If the time since the last charge cycle completion is too long, a flag may be set at 328 indicating that the calculated SOC should not be used in connection with the disclosed method, which in some embodiments may cause the method to terminate. If not, the method may proceed to 322.

At 322, a determination may be made whether a charge cycle complete has been triggered. If so, the method may proceed to 326, where the BOL SOC and the estimated capacity SOC may be reset to a charge termination point of the battery system, and a flag may be set at 330 indicating that the calculated SOC may be used in connection with the disclosed method. Otherwise, the method may proceed to 324, where a determination may be made whether the flag at 330 was previously set (i.e., whether the flag was set 330 indicating that the calculated SOC should be used). If not, a flag may be set at 328 indicating that the calculated SOC may not be used in connection with the disclosed method, which in some embodiments may cause the method to terminate. If so, a flag may be set at 330 indicating that the calculated SOC may be used in connection with the disclosed method.

In certain embodiments, to find stoichiometric points for OCV/SOC curve calculation, current may be integrated to compute an SOC that is not set or rest by voltage, thus avoiding creating a circulate dependence. SOC may be reset when the battery completes a full charge as the OCV/SOC curve may exhibit less shift at high SOC as the battery ages. If the battery has not been full-charged for a particular duration or the memory storage of a system implementing the disclosed systems and methods has been reset, the SOC calculated may not be used in connection with optimization processes consistent with the disclosed embodiments until a full charge has been completed.

A determination may be made at 334 whether the battery system is in use. If not, the method may wait until the battery system is in use. If so, the method may proceed to 336, where a determination may be made whether the battery system is in an equilibrium state. In some embodiments, an equilibrium state may comprise a state where the battery has been held at open-circuit for a sufficiently long time so that polarization built up by charging and discharging the battery has dissipated and/or there are no and/or relatively little transient effects. If not, the method may terminate at 338 as the battery system may not be rested. If so, the method may proceed to 340.

At 340, if the flag is set at 330 indicating that the calculated SOC may be used, a determination may be made whether the calculated SOC is usable. If not, the method may proceed to terminate at 338 as the battery system may not be rested. If so, the method may proceed to 342. At 342, the estimated capacity SOC for the battery system passed at 332 may be stored along with associated time information in one or more data bins determined by the associated BOL SOC. In some embodiments, the time information may comprise a running count associated to a time when a system implementing embodiments of the disclosed systems and methods is powered (e.g., connected to a 12V battery or the like).

A determination may be made at 344 whether the sections of the battery system (e.g., battery system subdivisions) have uniform and/or substantially uniform capacity. If the sections do not have uniform and/or substantially uniform capacity, the method may proceed to 348 where an average voltage of the sections, which may be scaled to a pack-level voltage, may be stored in one or more data bins determined by the associated BOL SOC. If the sections have uniform and/or substantially uniform capacity, the method may proceed to 346 where the pack voltage may be stored in one or more data bins determined by the associated BOL SOC.

At 350, it may be determined whether a sufficient number of data bins include new data since a prior update. If not, the method may terminate at 360 as insufficient data for the method to proceed may have been collected. If so, the method may proceed to 352, where it may be determined whether the spread of the data is sufficient. If not, the method may terminate at 360 as insufficient data for the method may have been collected. If so, the method may proceed to 354.

At 354, it may be determined whether the new data is centered at about 50%. If not, the method may terminate at 360 as insufficient data for the method may have been collected. If so, the method may proceed to 356, where it may be determined whether the new data locations are sufficiently varied. If not, the method may terminate at 360 as insufficient data for the method may have been collected. If so, an optimization process may be triggered at 358. In some embodiments, the OCV/SOC curve may exhibit a number of curves and/or a relatively steep decline at lower SOCs. In certain embodiments, steps 350-356 may, among other things, ensure that enough data, spanning a sufficiently wide range, is stored so that an accurate curve fit may be calculated.

The optimization process may begin by seeding an associated optimization algorithm at 362 with the stored values. In some embodiments, these values may be calculated by previous runs of the optimization process and/or BOL values if the optimization process has not been previously performed. The values may comprise, without limitation, stoichiometry values that are being optimized over, constant stoichiometry values, and/or measured voltages for the evaluation of an associated cost and/or error function. At 364, a determination may be made whether the sections of the battery system (e.g., battery system subdivisions) have uniform and/or substantially uniform capacity. If the sections have uniform and/or substantially uniform capacity, the method may proceed to 366 where the optimization may be performed using a single call (e.g., N=1). Otherwise, the method may proceed to 368 where the optimization process may be performed for each section (e.g., 1<n<=12).

At 370, a determination may be made whether an iteration limit for the recursive optimization process has been reached and, if not, whether an error in the optimization process is less than a threshold error. If the iteration limit has not been reached and/or the error in the optimization process is not less than a threshold error, a cost function associated with the optimization process may be evaluated at 372. At 374, partial derivatives for each set of parameters in the optimization process may be calculated and next parameters may be generated at 376.

Once the determination at 370 results in the iteration limit being reached or the optimization process error is less than the threshold error, the method may proceed to 378. At 378, the resulting optimized value may be stored in a blending buffer. A mean and a variance of the blending buffer values may be calculated at 380. At 382, a recursive least squares ("RLS") filter constant may be computed based on the calculated. mean and the variance. A filter may be applied using the computed RLS constant to the new optimized parameters and previously stored optimized parameters at 384.

At 386, a determination may be made whether the sections of the battery system (e.g., battery system subdivisions) have uniform and/or substantially uniform capacity. If the sections have uniform and/or substantially uniform capacity, the method may proceed to 388 where the blended parameters may be utilized to compute OCV axis information for an SOC/OCV curve associated with a first section of the battery system. Otherwise, the method may proceed to 390, where the blended parameters may be utilized to compute OCV axis information for an SOC/OCV curve associated with each section. At 392, the OCV axes calculated at 388 or 390 may be stored. The method may proceed to terminate at 394.

Figure 4:
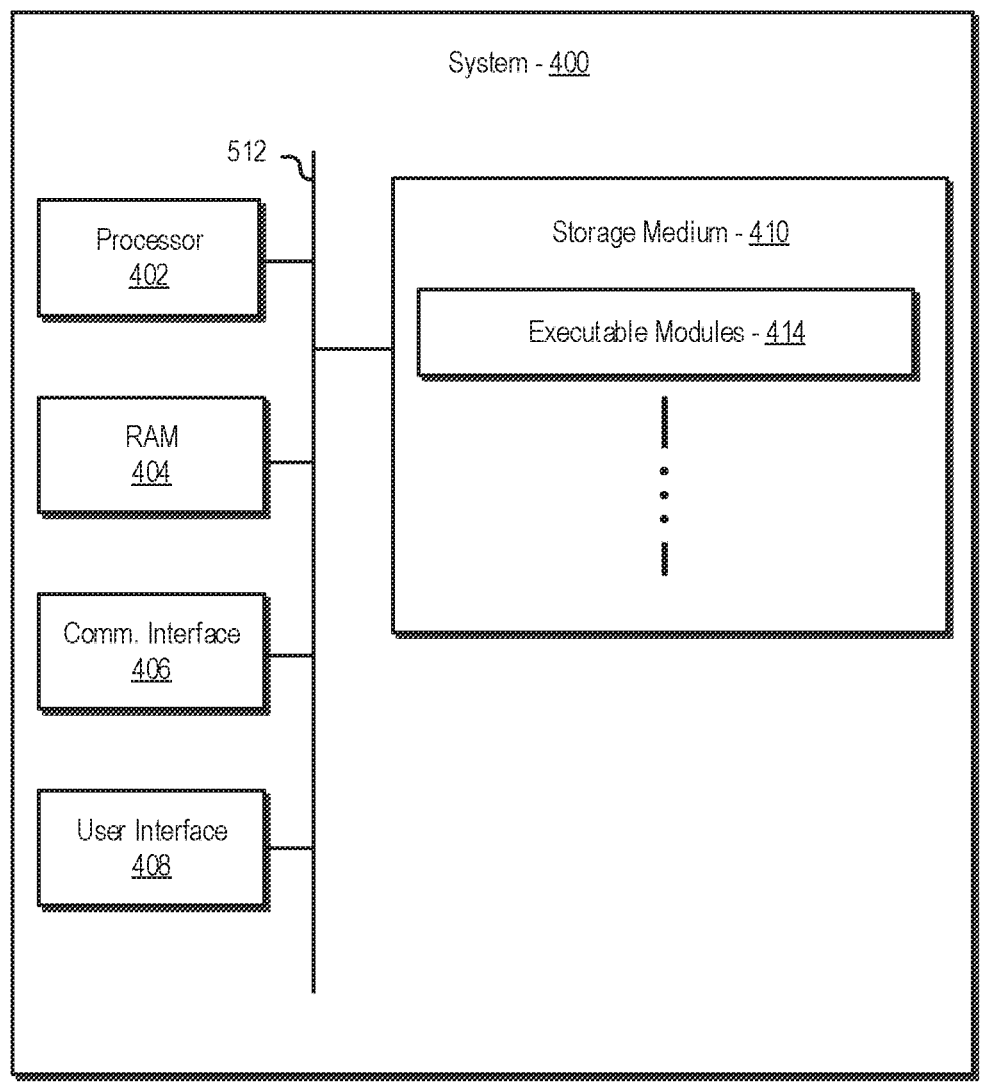
FIG. 4 illustrates an exemplary system for implementing certain embodiments of the systems and methods disclosed herein.

FIG. 4 illustrates an exemplary system 400 for implementing certain embodiments of the systems and methods disclosed herein. In certain embodiments, the computer system 400 may be a personal computer system, a server computer system, an on-board or internal vehicle computer, a battery control system, an external computer system, and/or any other type of system suitable for implementing the disclosed systems and methods. In further embodiments, the computer system 400 may be any portable electronic computer system or electronic device including, for example, a notebook computer, a smartphone, and/or a tablet computer.

As illustrated, the computer system 400 may include, among other things, one or more processors 402, random access memory ("RAM") 404, a communications interface 406, a user interface 408, and a non-transitory computer-readable storage medium 410. The processor 402, RAM 404, communications interface 406, user interface 408, and computer-readable storage medium 410 may be communicatively coupled to each other via a common data bus 412. In some embodiments, the various components of the computer system 400 may be implemented using hardware, software, firmware, and/or any combination thereof.

User interface 408 may include any number of devices allowing a user to interact with the computer system 400. For example, user interface 408 may be used to display an interactive interface to a user. The user interface 408 may be a separate interface system communicatively coupled with the computer system 400 or, alternatively, may be an integrated system such as a display interface for a laptop or other similar device. In certain embodiments, the user interface 408 may be produced on a touch screen display. The user interface 408 may also include any number of other input devices including, for example, keyboard, trackball, and/or pointer devices.

The communications interface 406 may be any interface capable of communicating with other computer systems, peripheral devices, and/or other equipment communicatively coupled to computer system 400. For example, the communications interface 506 may allow the computer system 400 to communicate with other computer systems (e.g., computer systems associated with external databases and/or the Internet), allowing for the transfer as well as reception of data from such systems. The communications interface 406 may include, among other things, a modem, a satellite data transmission system, an Ethernet card, and/or any other suitable device that enables the computer system 400 to connect to databases and networks, such as LANs, MANs, WANs and the Internet.

Processor 402 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 402 may be configured to execute computer-readable instructions stored on non-transitory computer-readable storage medium 410. Computer-readable storage medium 410 may store other data or information as desired. In some embodiments, the computer-readable instructions may include computer executable functional modules 414. For example, the computer-readable instructions may include one or more functional modules configured to implement all or part of the functionality of the systems and methods described above. Specific functional models that may be stored on computer-readable storage medium 410 may include modules to test, monitor, and/or model a relationship between an OCV and an SOC of a battery system as the battery system ages and/or any other module or modules configured to implement the systems and methods disclosed herein.

The system and methods described herein may be implemented independent of the programming language used to create the computer-readable instructions and/or any operating system operating on the computer system 400. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 400 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of operating a battery system of a vehicle, the vehicle including a vehicle body, a drivetrain, a plurality of wheels attached to the vehicle body, and an electric drive motor connected to the drivetrain and for driving at least one of the wheels, the battery system including a battery pack operable to power the electric drive motor, and a battery controller operable to control the battery pack, the battery pack including a plurality of battery cells and a sensor associated with each battery cell for measuring voltage, current, and/or temperature, each battery cell including lead-acid, nickel-metal hydride, lithium-ion, lithium-ion polymer, zinc-air, lithium-air, nickel-cadmium, valve-regulated lead-acid, absorbed glass mat, nickel-zinc, and/or molten salt, the method comprising:
   transmitting, via the battery controller of the vehicle, a command signal to the battery pack to transfer electrical power to the electric drive motor to thereby propel the vehicle;
   determining, via the battery controller based on a signal received from one or more of the sensors, an initial relationship between an open circuit voltage ("OCV") and a state of charge ("SOC") of a cell in the battery cells at a beginning of life of the cell;
   determining a change in one or more stoichiometric points of a half-cell of the cell, wherein determining the change in the one or more stoichiometric points of the half-cell comprises:
      measuring parameter information relating to one or more operating parameters of a battery portion including the half-cell;
      storing the measured parameter information in one or more data bins;
      identifying one or more updated stoichiometric points of the half-cell based on the stored measured parameter information using an optimization process; and
      determining the change in the one or more stoichiometric points based on the one or more identified updated stoichiometric points;
   adjusting the initial relationship between the OCV and the SOC of the cell based, at least in part, on the determined change in the one or more stoichiometric points of the half-cell to generate an updated relationship between the OCV and the SOC of the cell; and
   implementing, via the battery controller, a control action in the battery pack of the vehicle based on the updated relationship between the OCV and the SOC of the cell, the control action comprising controlling a battery system charging operation, a battery system discharging operation, and/or a battery system balancing operation.

2. The method of claim 1, wherein the updated relationship between the OCV and the SOC of the cell comprises an OCV/SOC curve associated with the cell.

3. The method of claim 1, wherein the optimization process comprises a gradient descent optimization process.

4. The method of claim 1, wherein the measured parameter information comprises a voltage of the battery portion, a SOC of the battery portion, and/or a time when the battery controller of the battery system initializes.

5. The method of claim 1, wherein the one or more data bins are designated based on a SOC associated with the initial relationship between the OCV and the SOC.

6. The method of claim 1, further comprising, prior to identifying the one or more updated stoichiometric points of the half-cell, determining a sufficiency of the measured parameter information stored in the one or more data bins.

7. The method of claim 1, further comprising determining at least one operating parameter of the battery system based on the updated relationship between the OCV and the SOC of the cell.

8. The method of claim 1, wherein adjusting the initial relationship between the OCV and the SOC of the cell to generate an updated relationship between the OCV and the SOC of the cell further comprises adjusting an OCV curve of the half-cell based in part on the determined change in the one or more stoichiometric points to generate an updated relationship between the OCV and the SOC of the cell.

9. The method of claim 1, wherein the control action further includes modifying the transfer of electrical power from the battery pack to the electric drive motor.

10. A motor vehicle, comprising:
   a vehicle body;
   a plurality of wheels attached to the vehicle body;
   an electric drive motor attached to the vehicle body and operable to drive at least one of the wheels;
   a battery pack attached to the vehicle body and operable to power the electric drive motor, the battery pack including a plurality of battery cells and a sensor associated with each battery cell for measuring voltage, current, and/or temperature, each battery cell including lead-acid, nickel-metal hydride, lithium-ion, lithium-ion polymer, zinc-air, lithium-air, nickel-cadmium, valve-regulated lead-acid, absorbed glass mat, nickel-zinc, and/or molten salt; and
   a battery controller operable to control the battery pack, the battery controller being configured to:
      transmit a command signal to the battery pack to transfer electrical power to the electric drive motor to thereby propel the vehicle;
      determine, based on a signal received from the one or more of the sensors, an initial relationship between an open circuit voltage ("OCV") and a state of charge ("SOC") of a cell in the battery cells at a beginning of life of the battery cell;
      measure parameter information relating to one or more operating parameters of a battery portion including the half-cell;
      store the measured parameter information in one or more data bins;
      identify one or more updated stoichiometric points of the half-cell based on the stored measured parameter information using an optimization process;
      determine a change in the one or more stoichiometric points based on the one or more identified updated stoichiometric points;
      adjust the initial relationship between the OCV and the SOC based on the determined change in the one or more stoichiometric points of the half-cell to generate an updated relationship between the OCV and the SOC of the cell; and
      control a battery system charging operation, a battery system discharging operation, and/or a battery system balancing operation based on the updated relationship between the OCV and the SOC of the cell.

11. The motor vehicle of claim 10, wherein the updated relationship between the OCV and the SOC of the cell comprises an OCV/SOC curve associated with the cell.

12. The motor vehicle of claim 10, wherein the optimization process comprises a gradient descent optimization process.

13. The motor vehicle of claim 10, wherein the measured parameter information includes a voltage of the battery portion, a SOC of the battery portion, and/or a time when the battery controller of the battery system initializes.

14. The motor vehicle of claim 10, wherein the one or more data bins are designated based on a SOC associated with the initial relationship between the OCV and the SOC.

15. The motor vehicle of claim 10, wherein the battery controller is further configured to determine, prior to identifying the one or more updated stoichiometric points of the half-cell, a sufficiency of the measured parameter information stored in the one or more data bins.

16. The motor vehicle of claim 10, wherein the battery controller is further configured to determine an operating parameter of the battery system based on the updated relationship between the OCV and the SOC of the cell.

17. The motor vehicle of claim 10, wherein adjusting the initial relationship between the OCV and the SOC of the cell to generate the updated relationship between the OCV and the SOC of the cell further includes adjusting an OCV curve of the half-cell based on the determined change in the one or more stoichiometric points to generate the updated relationship.

18. The motor vehicle of claim 10, wherein the control action further includes modifying the transfer of electrical power from the battery pack to the electric drive motor.

19. The motor vehicle of claim 10, wherein adjusting the initial relationship between the OCV and the SOC of the cell includes blending the one or more updated stoichiometric points by applying a low-pass smoothing filter to a history of stoichiometric point updates thereby preventing the stoichiometric points from changing irregularly over time.

20. The motor vehicle of claim 10, wherein the optimization process used to identify the one or more updated stoichiometric points of the half-cell includes minimizing an error function as:

$$\min(f(x_i,y_i)) = \min(\Sigma |V_{meas} - V_{est}(x_i,y_i)|) \approx 0,$$

where $f(x_i,y_i)$ is the error function, $V_{meas}$ is a measured equilibrated voltage, $V_{est}$ is an estimated open circuit voltage, and $x_i$ and $y_i$ are stoichiometry coefficients.

* * * * *